(12) United States Patent
Hsu et al.

(10) Patent No.: US 11,508,720 B2
(45) Date of Patent: Nov. 22, 2022

(54) MEMORY DEVICE INCLUDING ALIGNMENT LAYER AND SEMICONDUCTOR PROCESS METHOD THEREOF

(71) Applicant: eMemory Technology Inc., Hsin-Chu (TW)

(72) Inventors: Chia-Jung Hsu, Hsinchu County (TW); Wei-Ren Chen, Hsinchu County (TW); Wein-Town Sun, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 254 days.

(21) Appl. No.: 16/872,380

(22) Filed: May 12, 2020

(65) Prior Publication Data

US 2020/0365722 A1 Nov. 19, 2020

Related U.S. Application Data

(60) Provisional application No. 62/847,246, filed on May 13, 2019.

(51) Int. Cl.
*H01L 29/45* (2006.01)
*H01L 29/788* (2006.01)
(Continued)

(52) U.S. Cl.
CPC ...... *H01L 27/0274* (2013.01); *G11C 16/0433* (2013.01); *G11C 16/10* (2013.01); *G11C 16/14* (2013.01); *G11C 16/26* (2013.01); *H01L 23/60* (2013.01); *H01L 23/62* (2013.01); *H01L 27/0248* (2013.01); *H01L 27/0251* (2013.01);
(Continued)

(58) Field of Classification Search
None
See application file for complete search history.

(56) References Cited

U.S. PATENT DOCUMENTS 5,116,776 A * 5/1992 Chan ............... H01L 28/40
257/E27.089
6,177,304 B1 * 1/2001 Li ............... H01L 21/823481
257/E21.627
(Continued)

FOREIGN PATENT DOCUMENTS

TW 544924 8/2003
TW 201214677 A1 4/2012
(Continued)

*Primary Examiner* — Xiaoming Liu
(74) *Attorney, Agent, or Firm* — Winston Hsu

(57) ABSTRACT

A memory device includes a well, a first gate layer, a second gate layer, a doped region, a blocking layer and an alignment layer. The first gate layer is formed on the well. The second gate layer is formed on the well. The doped region is formed within the well and located between the first gate layer and the second gate layer. The blocking layer is formed to cover the first gate layer, the first doped region and a part of the second gate layer and used to block electrons from excessively escaping. The alignment layer is formed on the blocking layer and above the first gate layer, the doped region and the part of the second gate layer. The alignment layer is thinner than the blocking layer, and the alignment layer is thinner than the first gate layer and the second gate layer.

18 Claims, 6 Drawing Sheets

(51) Int. Cl.
  *H01L 27/02*    (2006.01)
  *H01L 21/28*    (2006.01)
  *G11C 16/04*    (2006.01)
  *G11C 16/10*    (2006.01)
  *G11C 16/14*    (2006.01)
  *G11C 16/26*    (2006.01)
  *H01L 29/66*    (2006.01)
  *H02M 1/14*     (2006.01)
  *H02M 3/07*     (2006.01)
  *H01L 23/60*    (2006.01)
  *H01L 23/62*    (2006.01)
  *H02H 9/04*     (2006.01)

(52) U.S. Cl.
  CPC ...... *H01L 27/0255* (2013.01); *H01L 27/0266* (2013.01); *H01L 27/0285* (2013.01); *H01L 27/0288* (2013.01); *H01L 29/40114* (2019.08); *H01L 29/456* (2013.01); *H01L 29/66825* (2013.01); *H01L 29/788* (2013.01); *H02H 9/046* (2013.01); *H02M 1/14* (2013.01); *H02M 3/07* (2013.01)

(56) References Cited

U.S. PATENT DOCUMENTS

| | | | |
|---|---|---|---|
| 6,326,661 B1* | 12/2001 | Dormans | ............... H01L 27/115 257/314 |
| 2007/0170489 A1 | 7/2007 | Fang | |
| 2016/0232977 A1* | 8/2016 | Yamakoshi | ............. G11C 16/14 |
| 2018/0019252 A1* | 1/2018 | Li | ........................ H01L 29/1095 |

FOREIGN PATENT DOCUMENTS

| | | |
|---|---|---|
| TW | 201810618 A | 3/2018 |
| TW | 201812774 A | 4/2018 |
| TW | 201824520 A | 7/2018 |

* cited by examiner

MEMORY DEVICE INCLUDING ALIGNMENT LAYER AND SEMICONDUCTOR PROCESS METHOD THEREOF

CROSS REFERENCE TO RELATED APPLICATIONS

This application claims priority to provisional Patent Application No. 62/847,246, filed 2019 May 13, and incorporated herein by reference in its entirety.

BACKGROUND OF THE INVENTION

1. Field of the Invention

The application is related to a memory device and a semiconductor process method, and more particularly, a memory device including an alignment layer and a semiconductor process method for generating the memory device.

2. Description of the Prior Art

For a memory device, the retention (retention time) can be an important parameter to evaluate performance. When a memory device has a longer retention, the memory device can storage data for a longer period of time, and the reliability and quality of the memory device can be regarded better.

Further, the efficiency of memory operations such as programming, erasing and reading has to be considered when evaluating the performance of a memory device. The efficiency of a memory operation can be estimated according to the operation time and the controllability related to the memory operation. If the controllability is higher, the probability of failing to perform a memory operation can be reduced.

Hence, a solution for improving the retention and the controllability of a memory device is in need in the field.

SUMMARY OF THE INVENTION

An embodiment discloses a memory device including a well, a first gate layer, a second gate layer, a doped region, a blocking layer and an alignment layer. The well is formed on a substrate. The first gate layer is formed on the well. The second gate layer is formed on the well. The doped region is formed within the well and located between the first gate layer and the second gate layer. The blocking layer is formed to cover the first gate layer, the first doped region and a part of the second gate layer and used to block electrons from excessively escaping. The alignment layer is formed on the blocking layer and above the first gate layer, the doped region and the part of the second gate layer. The alignment layer is thinner than the blocking layer, and the alignment layer is thinner than the first gate layer and the second gate layer.

Another embodiment discloses a semiconductor process method for generating a memory device including forming a first gate layer and a second gate layer on a well; depositing a blocking layer to cover the first gate layer and the second gate layer; depositing an alignment layer to cover the blocking layer; using a photomask to apply a photoresist for removing a part of the alignment layer for a remaining portion of the alignment layer to cover a first region between the first gate layer and the second gate layer, a second region beside the first gate layer, the first gate layer and a part of the second gate layer; and using the photoresist to remove a part of the blocking layer for a remaining portion of the blocking layer to cover the first region between the first gate layer and the second gate layer, the second region beside the first gate layer, the first gate layer and the part of the second gate layer. The alignment layer is thinner than the blocking layer, and the alignment layer is thinner than the first gate layer and the second gate layer.

These and other objectives of the present invention will no doubt become obvious to those of ordinary skill in the art after reading the following detailed description of the preferred embodiment that is illustrated in the various figures and drawings.

DETAILED DESCRIPTION

In the text, when a region or element (e.g., A) is described to be located between two regions and/or elements (e.g., B and C), it means A is approximately located between B and C, and it is possible for A to partially contact or overlap B and/or C. Likewise, when a region or element (e.g., A) is described to be located beside a region or element (e.g., D), it means A is approximately located beside D, and it is possible for A to partially contact or overlap D.

Figure 1:
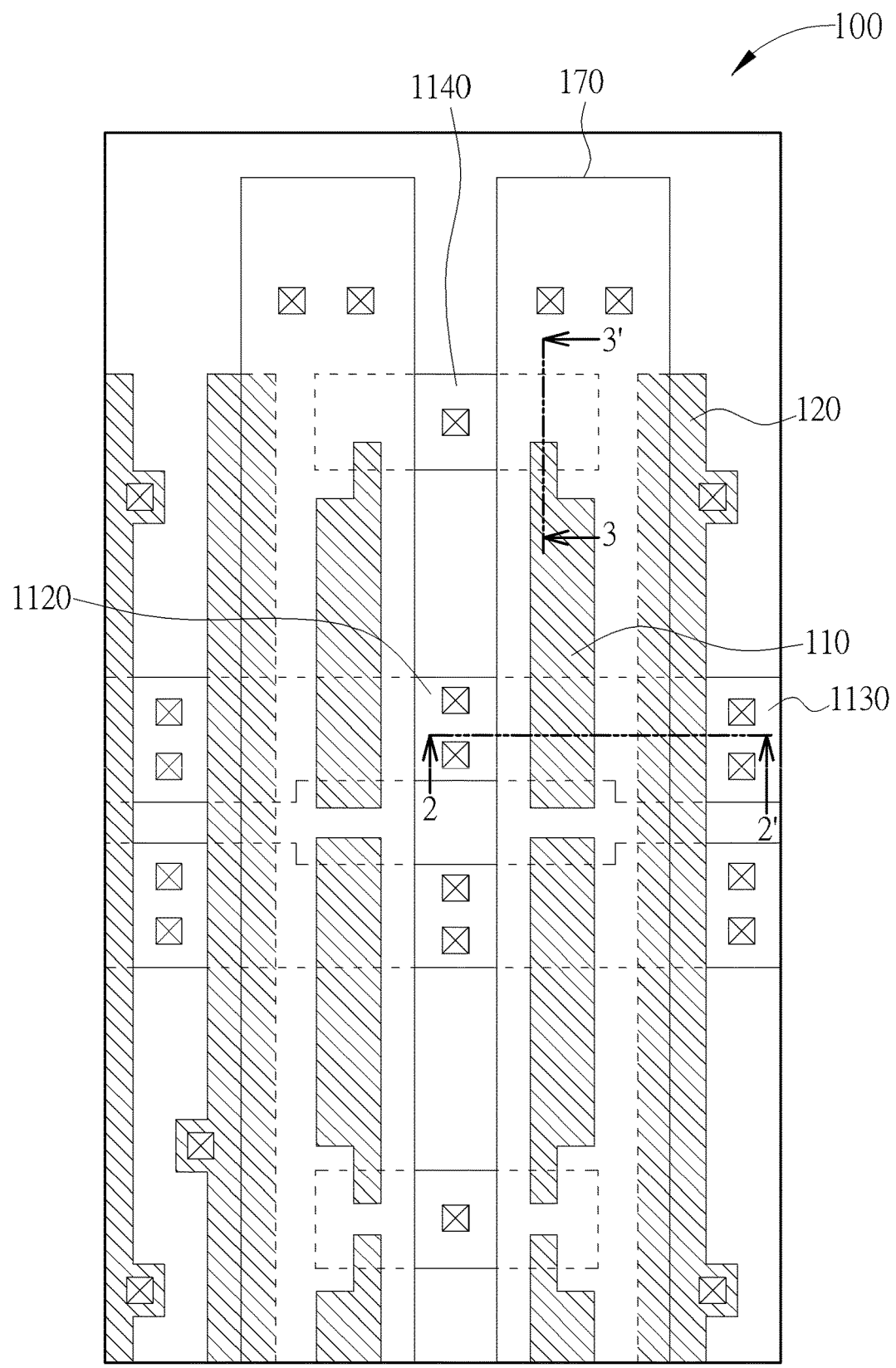
FIG. 1 illustrates a layout of the memory device according to an embodiment.
Figure 2:
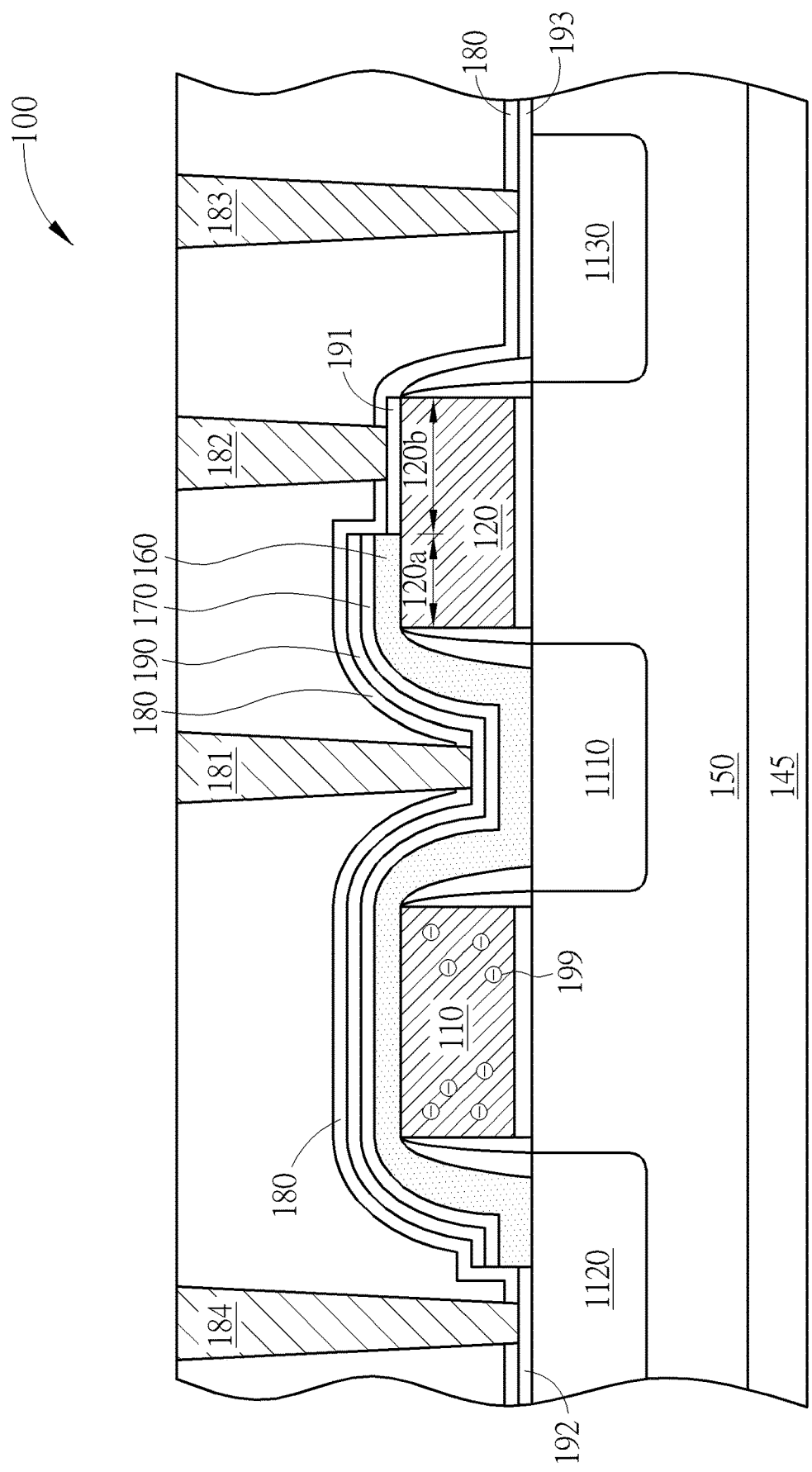
FIG. 2 is a cross-sectional view of a portion of a memory device of FIG. 1.

FIG. 1 illustrates a layout of a memory device 100 according to an embodiment. FIG. 2 is a cross-sectional view of a portion of a memory device 100 of FIG. 1 along line 2-2'. The memory device 100 includes a first well 150, a first gate layer 110, a second gate layer 120, a first doped region 1110, a blocking layer 160, an alignment layer 170, a contact etch stop layer 180, four salicide layers 190, 191, 192 and 193, a second doped region 1120 and a third doped region 1130.

The first well 150 may be formed on a substrate 145. The first gate layer 110 and the second gate layer 120 may be formed on the first well 150. The first doped region 1110 may be formed within the first well 150 and located between the first gate layer 110 and the second gate layer 120.

The blocking layer 160 may be formed to cover the first gate layer 110, the first doped region 1110 and a first part 120a of the second gate layer 120 and used to block electrons 199 from excessively escaping. The blocking layer 160 may be a salicide blocking (SAB) layer or a resist-protection-oxide (RPO) layer used for improving resistance.

The alignment layer 170 may be formed on the blocking layer 160 and above the first gate layer 110, the first doped region 1110 and the first part 120a of the second gate layer 120. Hence, the blocking layer 160 and the alignment layer 170 may be substantially aligned.

The alignment layer 170 is thinner than the blocking layer 160, and the alignment layer 170 is thinner than the first gate layer 110 and the second gate layer 120.

According to an embodiment, a thickness of the alignment layer 170 is less than 25% of a thickness of the first gate layer 110. A thickness of the blocking layer 160 is larger than 25% of the thickness of the first gate layer 110. The thickness of the first gate layer 110 may be close to or substantially the same as a thickness of the second gate layer 120. For example, the thicknesses of the first gate layer 110, the blocking layer 160 and the alignment layer 170 may be around (but not limited to) 2000 angstroms (Å), 1000 Å and 300 Å respectively. Hence, the alignment layer 170 is a thin layer compared to the first gate layer 110, the blocking layer 160 and the second gate layer 120.

The contact etch stop layer 180 may be formed on the alignment layer 170 and a second part 120b of the second gate layer 120 and used to stop etching of a contact generation process. According to an embodiment, the contact etch stop layer 180 may be formed further on the second doped region 1120 and the third doped region 1130.

The first gate layer 110, the second gate layer 120 and the alignment layer 170 may be formed with polycrystalline silicon.

As shown in FIG. 2, the salicide layer 190 may be formed between the alignment layer 170 and the contact etch stop layer 180. The salicide layer 191 may be formed between the second part 120b of the second gate layer 120 and the contact etch stop layer 180. The salicide layers 190 and 191 may be formed by chemical reaction since the alignment layer and the second gate layer 120 may be formed with polycrystalline silicon. Likewise, the salicide layers 192 and 193 may be formed between the contact etch stop layer 180 and the second doped region 1120 and between the contact etch stop layer 180 and the third doped region 1130 respectively by chemical reaction. The salicide layers 190, 191, 192 and 193 may be conductive and used to conduct electricity.

As shown in FIG. 2, the second doped region 1120 may be formed within the first well 150 and located beside the first gate layer 110. The third doped region 1130 may be formed within the first well 150 and located beside the second gate layer 120.

Figure 3:
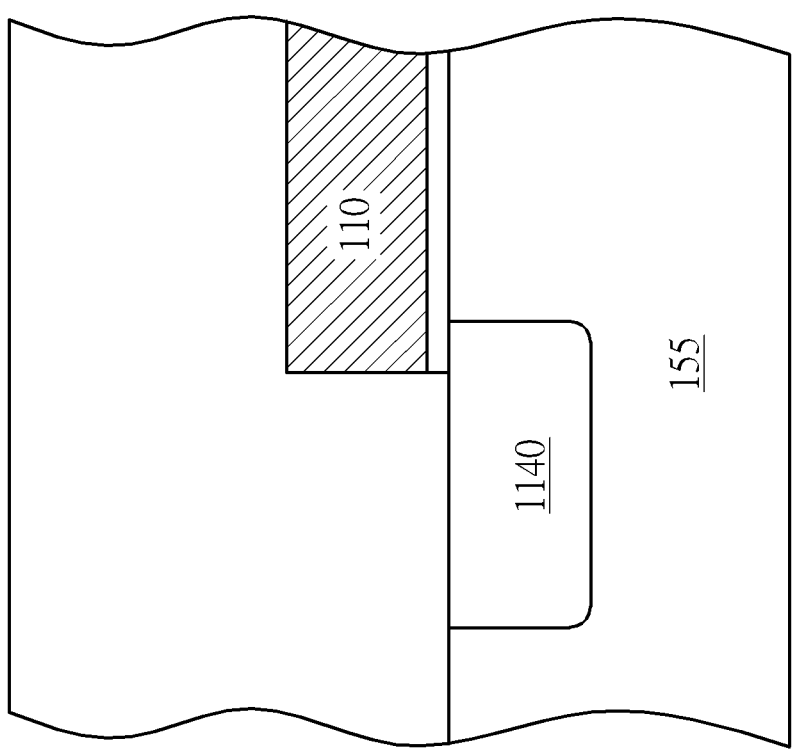
FIG. 3 is a cross-sectional view of a portion of the memory device of FIG. 1.

FIG. 3 is a cross-sectional view of a portion of the memory device 100 along a line 3-3'.

As shown in FIG. 3, the first gate layer 110 may further cover a part of a fourth doped region 1140 formed within a second well 155. According to an embodiment, the first well 150 may be formed within the second well 155.

According to an embodiment, the first well 150 may be an N-type well. The second well 155 may be a P-type well. The first doped region 1110, the second doped region 1120 and the third doped region 1130 may be P-type doped regions. The second well 155 mentioned herein may be a P-type well or a P-sub (P-type substrate). The fourth doped region 1140 may be an N-type doped region.

Regarding a structure of the memory device 100, the first gate layer 110 may be a floating gate (referred to as FG). The second gate layer 120 may be a select gate (referred to as SG) and a word line (referred to as WL). The second doped region 1120 may be a bit line (referred to as BL). The third doped region 1130 may be a source line (referred to as SL). The fourth doped region 1140 may be an erase line (referred to as EL).

Because the first gate layer 110 (floating gate) may cover a part of a fourth doped region 1140 (erase line), when intending to apply a voltage to the first gate layer 110, the voltage may be applied to the fourth doped region 1140, and the first gate layer 110 may receive the voltage through a coupling effect. However, the efficiency and controllability may be insufficient if only relying on the coupling effect from the fourth doped region 1140 to apply a voltage to the first gate layer 110. As shown in FIG. 2, in addition to merely applying a voltage to the first gate layer 110 through the fourth doped region 1140 with the coupling effect, the voltage may be coupled to the first gate layer 110 through a first contact 181 and the salicide layer 190 and the alignment layer 170. Hence, the controllability and efficiency of operating the memory device 100 can be improved, and the time of operating the memory device may be reduced.

As shown in FIG. 2, the memory device 100 may further include the first contact 181, a second contact 182, a third contact 183 and a fourth contact 184.

The abovementioned contact generation process may be used to generate the first contact 181 to the fourth contact 184.

The first contact 181 may be formed to contact the salicide layer 190 and be used to apply a voltage to the alignment layer 170 so that the voltage may be applied to the first gate layer 110 by means of coupling effect.

The second contact 182 may be formed above the second gate layer 120, contact the salicide layer 191 and be used to apply another voltage to the second gate layer 120.

The third contact 183 may be formed above the third doped region 1130, contact the salicide layer 193 and be used to apply another voltage to the third doped region 1130.

The fourth contact 184 may be formed above the second doped region 1120, contact the salicide layer 192 and be used to apply another voltage to the second doped region 1120.

The contacts 181 to 184 may be used to apply voltages for the memory operations described in the following Table 1.

The memory device 100 may support memory operations such as program operation, positive erase operation, negative erase operation, soft-program operation and read operation. In each operation, the voltages applied to the memory device 100 may be described in Table 1.

TABLE 1

|  | Program operation | positive erase operation | Negative erase operation | Soft-program operation | Read operation |
| --- | --- | --- | --- | --- | --- |
| First well 150 | V1 | 0 | 0 | V6 | V8 |
| Second well 155 | 0 | 0 | 0 | 0 | 0 |
| Third doped region 1130 (Source line) | V1 | 0 | V5 | V6 | V8 |
| Second doped region 1120 (Bit Line) | 0 | 0 | V5 | 0 | V9 |
| Second gate layer 120 (Select gate/Word line) | V2 | 0 | V5 | V6 | 0 |
| Fourth doped region 1140 (Erase line) | V3 | V4 | V4 | V7 | V10 |
| Salicide layer 190 | V3 | 0 | V5 | V7 | V10 |

As shown in Table 1, in a program operation, a first voltage V1 is applied to the first well 150 and the third doped region 1130. A zero voltage (denoted as 0) is applied to the second well 155 and the second doped region 1120. A second voltage V2 is applied to the second gate layer 120. A third voltage V3 is applied to the fourth doped region 1140 and the salicide layer 190. The first voltage V1 and the second voltage V2 are positive voltages. The second voltage V2 is not greater than the first voltage V1. In other words, it may be expressed as V2≤V1. The third voltage V3 may vary from a zero voltage to the second voltage V2. For example, V1=7 volts, V2=½ V1=3.5 volts, and V3 varies from 0 volts to 3.5 volts.

Regarding the third voltage V3, the third voltage V3 may vary from the zero voltage to the second voltage V2 in K steps, and K is an integer larger than 0. For example, if K=1, the third voltage V3 may vary in two stages. In the first stage, the third voltage V3 may be 0 volts to avoid a stuck bit. In the second stage, the third voltage V3 may be 3.5 volts to allow more electrons entering the first gate layer 110 (e.g., floating gate).

As shown in Table 1, in a positive erase operation, a zero voltage is applied to the first well 150, the second well 155, the second doped region 1120, the third doped region 1130, the second gate layer 120 and the salicide layer 190. A fourth voltage V4 is applied to the fourth doped region 1140, and the fourth voltage V4 is a positive voltage. For example, the fourth voltage V4 may be a higher voltage such as 15 volts. In the positive erase operation, electrons may be pulled out from the first gate layer 110 to the fourth doped region 1140.

As shown in Table 1, in a negative erase operation, a zero voltage is applied to the first well 150 and the second well 155. The fourth voltage V4 is applied to the fourth doped region 1140. A fifth voltage V5 is applied to the second doped region 1120, the third doped region 1130, the second gate layer 120 and the salicide layer 190. The fourth voltage V4 is a positive voltage, and the fifth voltage V5 is a negative voltage. For example, fourth voltage V4 may be a higher voltage such as 15 volts, and the fifth voltage V5 may be −7 volts. In another example, if the device breaks down, the fourth voltage V4 may be adjusted to be 10 volts.

As shown in Table 1, in a soft-program operation, a sixth voltage V6 is applied to the first well 150, the third doped region 1130 and the second gate layer 1120. A zero voltage is applied to the second well 155 and the second doped region 1120. A seventh voltage V7 is applied to the fourth doped region 1140 and the salicide layer 190. The six voltage V6 and the seventh voltage V7 are positive voltages, and the seventh voltage V7 is not greater than the sixth voltage V6. In other words, it may be expressed as V7<V6. For example, the sixth voltage V6 may be 7 volts, and the seventh voltage V7 may be 3.5 volts. The soft-program operation may be performed to allow a small amount of electrons to enter the first gate layer 110 so as to prepare for a subsequent program operation. The soft-program operation may be performed with band-to-band hot electron injection.

As shown in Table 1, in a read operation, an eight voltage V8 is applied to the first well 150 and the third doped region 1130. A zero voltage is applied to the second well 155 and the second gate layer 120. A ninth voltage V9 is applied to the second doped region 1120. A tenth voltage V10 is applied to the fourth doped region 1140 and the salicide layer 190. The eighth voltage V8 is a positive voltage. The ninth voltage V9 is equal to the zero voltage or slightly higher than the zero voltage. The tenth voltage V10 is between the zero voltage and the eighth voltage V8. In other words, 0<V10<V8. For example, the eighth voltage V8 may be 2.5 volts, the ninth voltage V9 may be 0 or 0.4 volts, and the tenth voltage V10 may be between 0 and 2.5 volts. Regarding the tenth voltage V10, when the tenth voltage V10 is higher, a current flowing from the third doped region 1130 to the first doped region 1110 may be lower.

Figure 4:
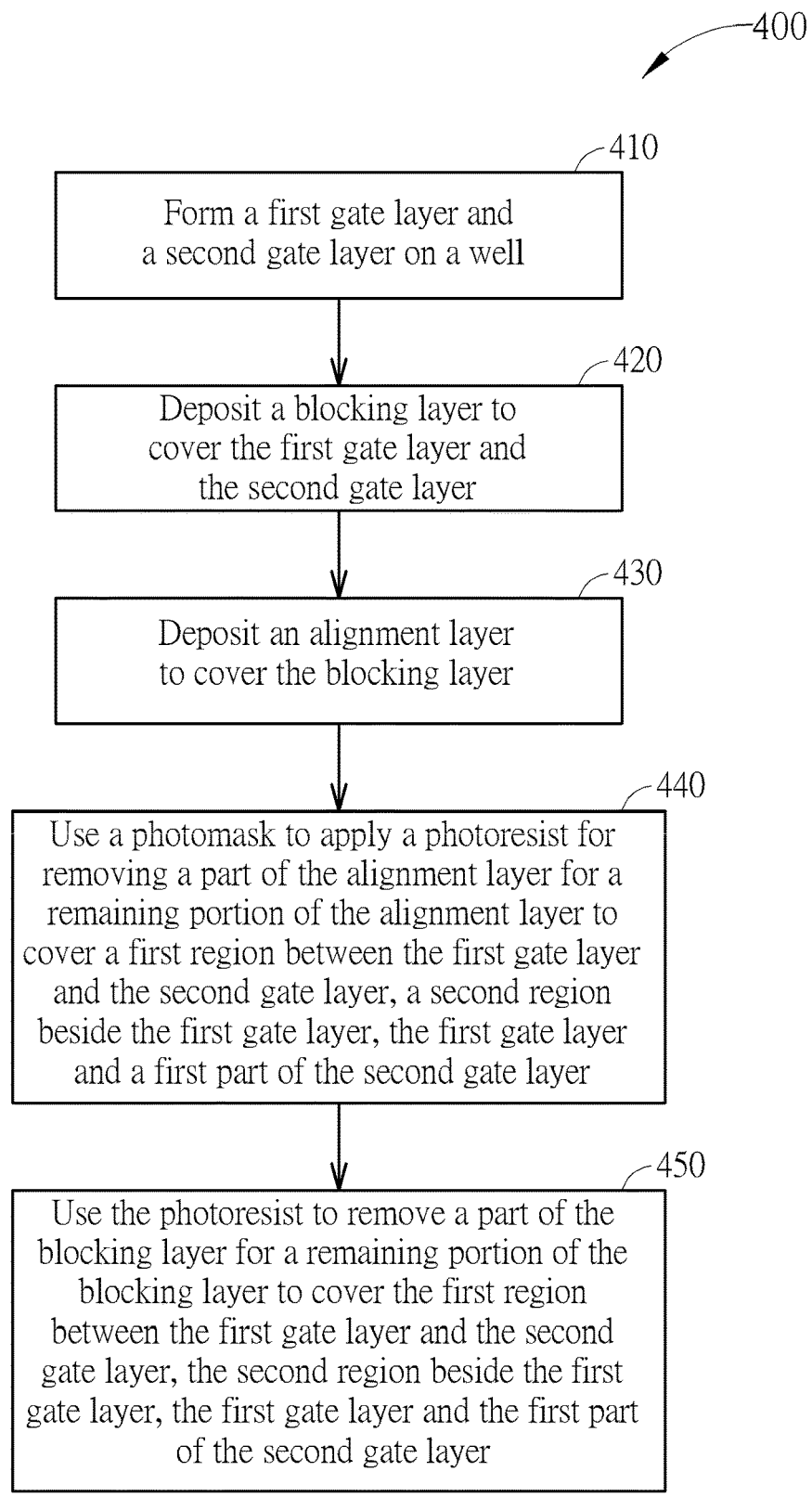
FIG. 4 illustrates a flowchart of a semiconductor process method for generating the memory device of FIG. 2.

FIG. 4 is a flowchart of a semiconductor process method 400 for generating the memory device 100 of FIG. 2. FIG. 5 to FIG. 8 illustrate the process of performing the method 400 of FIG. 4. As shown in FIG. 1 to FIG. 8, the method 400 may include following steps.

Step 410: form a first gate layer 110 and a second gate layer 120 on a well 150;

Step 420: deposit a blocking layer 160 to cover the first gate layer 110 and the second gate layer 120;

Step 430: deposit an alignment layer 170 to cover the blocking layer 160;

Step 440: use a photomask to apply a photoresist 755 for removing a part of the alignment layer 170 for a remaining portion of the alignment layer 170 to cover a first region 710 between the first gate layer 110 and the second gate layer 120, a second region 720 beside the first gate layer 110, the first gate layer 110 and a first part 120a of the second gate layer 120; and Step 450: use the photoresist 755 to remove a part of the blocking layer 160 for a remaining portion of the blocking layer 160 to cover the first region 710 between the first gate layer 110 and the second gate layer 120, the second region 720 beside the first gate layer 110, the first gate layer 110 and the first part 120a of the second gate layer 120.

Figure 5:
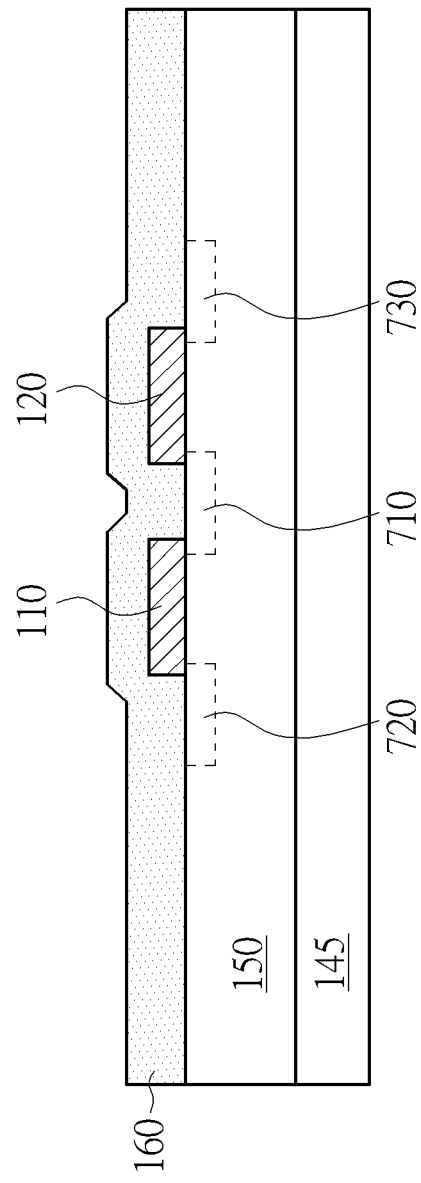
FIG. 5 to FIG. 8 illustrate the process of performing the method of FIG. 4.
Figure 6:
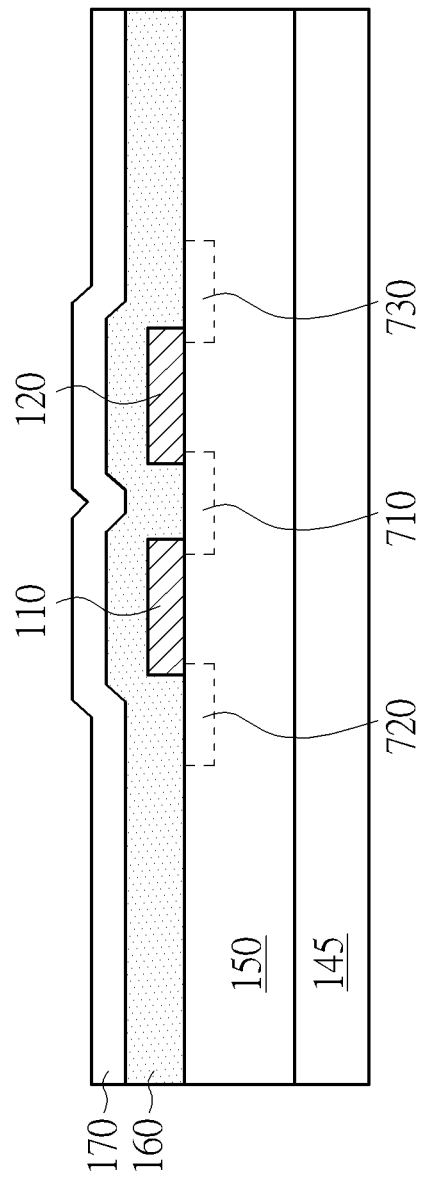

Step 410 to Step 430 may be corresponding to FIG. 5 and FIG. 6. Step 440 may be corresponding to FIG. 7. Step 450 may be corresponding to FIG. 8.

Regarding Step 410, the first gate layer 110 and the second gate layer 120 may be formed on the well 150, spacers and implanted regions according to an embodiment. Regarding Step 420, the blocking layer 160 may be deposited to cover the first gate layer 110, the second gate layer 120, the spacers and the implanted regions according to an embodiment.

Figure 7:
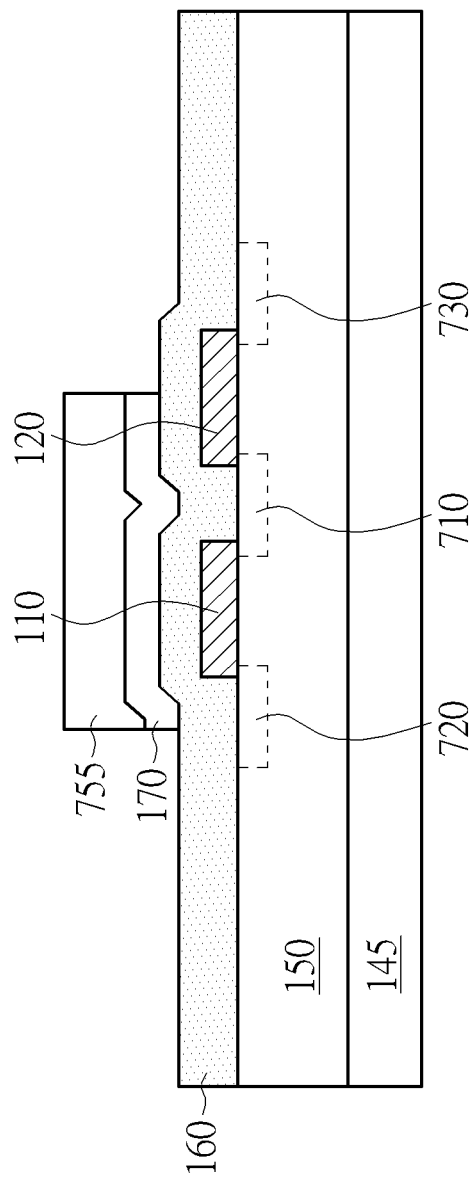

In FIG. 7 and Step 440, the mentioned photomask may be used to coat the alignment layer 170 with the photoresist 755 on a planned region. This is to maintain a part of the alignment layer 170 and apply a first chemical for etching and removing another part of the alignment layer 170.

Figure 8:
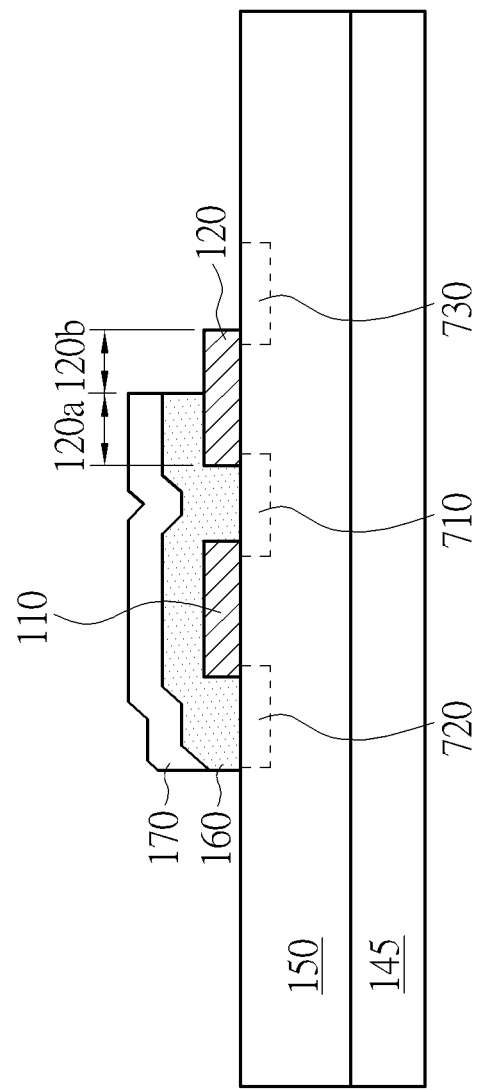

Likewise, in FIG. 8 and Step 450, a second chemical is applied to etch and remove a part of the blocking layer 160. The photoresist 755 may be removed then.

Regarding FIG. 7 to FIG. 8 and Step 440 to Step 450, a same photomask may be used for depositing and etching the alignment layer 170 and the blocking layer 160. Hence, the alignment layer 170 may be generated without using extra photomask.

Regarding FIG. 2 and FIG. 5 to FIG. 8, according to an embodiment, a doping operation may be performed to form the first doped region 1110 corresponding to the first region 710, the second doped region 1120 corresponding to the second region 720, and the third doped region 1130 corresponding to a third region 730 beside the second gate layer 120. By means of the blocking layer 160, electrons may be prevented from excessively escaping from the first gate layer 110, and the retention of the memory device 100 may be improved. By means of the alignment layer 170, the contact etch stop layer 180 and the blocking layer 160 may be better isolated from one another so as to improve the yield.

Further, a voltage may be applied to the first gate layer 110 by the coupling effect through the first contact 181, the salicide layer 190 and the alignment layer 170, and the controllability, flexibility and efficiency related to memory operations may hence be improved.

Hence, the memory device and the semiconductor process method provided by embodiments can effectively reduce problems in the field.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory device, comprising:
a first well formed on a substrate;
a first gate layer formed on the first well;
a second gate layer formed on the first well;
a first doped region formed within the first well and located between the first gate layer and the second gate layer;
a blocking layer formed to cover the first gate layer, the first doped region and a first part of the second gate layer and configured to block electrons from excessively escaping; and
an alignment layer formed on the blocking layer and above the first gate layer, the first doped region and the first part of the second gate layer;
wherein the alignment layer is thinner than the blocking layer, and the alignment layer is thinner than the first gate layer and the second gate layer;
wherein a thickness of the alignment layer is less than 25% of a thickness of the first gate layer, and a thickness of the blocking layer is larger than 25% of the thickness of the first gate layer.

2. The memory device of claim 1, wherein the first gate layer, the second gate layer and the alignment layer are formed with polycrystalline silicon.

3. The memory device of claim 1, wherein the first gate layer is a floating gate, and the second gate layer is a select gate.

4. The memory device of claim 1, further comprising:
a contact etch stop layer formed on the alignment layer and a second part of the second gate layer and configured to stop etching of a contact generation process.

5. The memory device of claim 4, further comprising:
a first salicide layer formed between the alignment layer and the contact etch stop layer; and
a second salicide layer formed between the second part of the second gate layer and the contact etch stop layer.

6. The memory device of claim 5, further comprising:
a second doped region formed within the first well and located beside the first gate layer;
a third doped region formed within the first well and located beside the second gate layer;
a third salicide layer formed between the contact etch stop layer and the second doped region; and
a fourth salicide layer formed between the contact etch stop layer and the third doped region.

7. The memory device of claim 6, wherein the first well is an N-type well, the first doped region, the second doped region and the third doped region are P-type doped regions.

8. The memory device of claim 6, wherein the first gate layer further covers a part of a fourth doped region formed within a second well, the first gate layer is a floating gate, the second gate layer is a select gate and a word line, the second doped region is a bit line, the third doped region is a source line, and the fourth doped region is an erase line.

9. The memory device of claim 8, wherein in a program operation, a first voltage is applied to the first well and the third doped region, a zero voltage is applied to the second well and the second doped region, a second voltage is applied to the second gate layer, a third voltage is applied to the fourth doped region and the first salicide layer, the first voltage and the second voltage are positive voltages, the second voltage is less than or equal to the first voltage, and the third voltage varies from a zero voltage to the second voltage.

10. The memory device of claim 9, wherein the third voltage varies from the zero voltage to the second voltage in K steps, and K is an integer larger than 0.

11. The memory device of claim 8, wherein in a positive erase operation, a zero voltage is applied to the first well, the second well, the second doped region, the third doped region, the second gate layer and the first salicide layer, a fourth voltage is applied to the fourth doped region, and the fourth voltage is a positive voltage.

12. The memory device of claim 8, wherein in a negative erase operation, a zero voltage is applied to the first well and the second well, a fourth voltage is applied to the fourth doped region, a fifth voltage is applied to the second doped region, the third doped region, the second gate layer and the first salicide layer, the fourth voltage is a positive voltage, and the fifth voltage is a negative voltage.

13. The memory device of claim 8, wherein in a soft-program operation, a sixth voltage is applied to the first well, the third doped region and the second gate layer, a zero voltage is applied to the second well and the second doped region, a seventh voltage is applied to the fourth doped region and the first salicide layer, the six voltage and the seventh voltage are positive voltages, and the seventh voltage is less than or equal to the sixth voltage.

14. The memory device of claim 8, wherein in a read operation, an eight voltage is applied to the first well and the third doped region, a zero voltage is applied to the second well and the second gate layer, a ninth voltage is applied to the second doped region, a tenth voltage is applied to the fourth doped region and the first salicide layer, the eighth voltage is a positive voltage, the ninth voltage is equal to the zero voltage or slightly higher than the zero voltage, and the tenth voltage is between the zero voltage and the eighth voltage.

15. The memory device of claim 6, further comprising:
a first contact formed to contact the first salicide layer and configured to apply a voltage to the alignment layer and the first gate layer;
a second contact formed above the second gate layer, contacting the second salicide layer and configured to apply another voltage to the second gate layer;
a third contact formed above the third doped region, contacting the fourth salicide layer and configured to apply another voltage to the third doped region; and
a fourth contact formed above the second doped region, contacting the third salicide layer and configured to apply another voltage to the second doped region.

16. A semiconductor process method for generating a memory device, comprising:
forming a first gate layer and a second gate layer on a well;
depositing a blocking layer to cover the first gate layer and the second gate layer;
depositing an alignment layer to cover the blocking layer;
using a photomask to apply a photoresist for removing a part of the alignment layer for a remaining portion of the alignment layer to cover a first region between the first gate layer and the second gate layer, a second region beside the first gate layer, the first gate layer and a part of the second gate layer; and
using the photoresist to remove a part of the blocking layer for a remaining portion of the blocking layer to cover the first region between the first gate layer and the second gate layer, the second region beside the first gate layer, the first gate layer and the part of the second gate layer;

wherein the alignment layer is thinner than the blocking layer, the alignment layer is thinner than the first gate layer and the second gate layer, a thickness of the alignment layer is less than 25% of a thickness of the first gate layer, and a thickness of the blocking layer is larger than 25% of the thickness of the first gate layer.

17. The method of claim 16, wherein the first gate layer, the second gate layer and the alignment layer are formed with polycrystalline silicon.

18. The method of claim 16, further comprising:

performing a doping operation to form a first doped region corresponding to the first region, a second doped region corresponding to the second region, and a third doped region corresponding to a third region beside the second gate layer.

\* \* \* \* \*